United States Patent [19]

Ozdemir et al.

[11] 4,109,029

[45] Aug. 22, 1978

[54] HIGH RESOLUTION ELECTRON BEAM MICROFABRICATION PROCESS FOR FABRICATING SMALL GEOMETRY SEMICONDUCTOR DEVICES

[75] Inventors: Faik S. Ozdemir, Thousand Oaks; Dall D. Loper, Fresno, both of Calif.

[73] Assignee: Hughes Aircraft Company, Culver City, Calif.

[21] Appl. No.: 761,934

[22] Filed: Jan. 24, 1977

[51] Int. Cl.² ............................................ H01L 29/48
[52] U.S. Cl. ........................................ 427/84; 96/36; 29/591; 156/644; 250/492 A; 250/492 B; 357/15; 357/22; 357/52; 427/89; 427/90; 427/96; 427/383 R; 427/8
[58] Field of Search ............... 427/84, 89, 90, 96, 427/383 R, 8; 357/15, 22, 52; 250/492 A, 492 B; 156/644; 96/36, 36.2; 29/591

[56] References Cited

U.S. PATENT DOCUMENTS 3,609,477   9/1971   Drangeid et al. ............... 357/22
3,914,784  10/1975   Hunsperger et al. ............. 357/15

OTHER PUBLICATIONS

Wolf et al., J. Vac. Sci. Technol. vol. 12, Dec., 1975.

Primary Examiner—John D. Smith
Attorney, Agent, or Firm—William J. Bethurum; W. H. MacAllister

[57] ABSTRACT

The specification describes a process for fabricating semiconductor devices and circuits in which lateral geometry dimensions determining the performance level of the device or circuit are extremely small. In this process electron beam microfabrication techniques are used to define these extremely small dimensions. The complete fabrication process uses standard photolithography for the definition of some of the device geometry and mask patterns, and partitioning of pattern definition between electron beam microfabrication and standard photolithography is utilized according to pattern resolution requirements, and is optimized for the highest yield-throughout product.

13 Claims, 13 Drawing Figures

4,109,029

HIGH RESOLUTION ELECTRON BEAM MICROFABRICATION PROCESS FOR FABRICATING SMALL GEOMETRY SEMICONDUCTOR DEVICES

FIELD OF THE INVENTION

This invention relates generally to semiconductor device and integrated circuit fabrication processes and more particularly to a high resolution electron beam microfabrication process for making Schottky barrier gate fieldeffect transistors (SBFETs).

BACKGROUND

Schottky barrier gate field-effect transistors (SBFET's) fabricated in gallium arsenide are generally well known in the microwave industry and have proven useful as high frequency amplifiers at frequencies up to 12 GHz or higher. These gallium arsenide metal-semiconductor devices are also known in the art as MESFETS, an acronym for Metal Epitaxial Semiconductor Field Effect Transistor, and have been recently described, for example, by D. R. Chen et al, *Microwave Journal,* International Edition, Vol. 18, No. 11, November, 1975 at page 60, and by Richard T. Davis in *Microwaves,* Vol. 14, No. 11, November, 1975, at page 38, and also by Stacy V. Bearse in a state-of-the-art type article entitled "GaAs FETs: Device Designers Solving Reliability Problems" *Microwaves,* February, 1976 at page 32. These gallium arsenide (GaAs) Schottky gate field-effect devices operate at generally higher frequencies than their silicon counterparts as a result of the higher carrier mobilities of gallium arsenide, and they generally include some preconfigured channel region, such as an epitaxial or ion-implanted GaAs channel layer, formed on or in a high resistivity semi-insulating GaAs substrate. Source and drain electrode contacts and an intermediate Schottky gate electrode contact may then be deposited directly on the upper surface of the GaAs channel region. When a suitable control voltage, $V_g$, is applied between the source and gate electrodes, the width of the channel depletion region beneath the gate electrode can be controlled to thereby modulate the channel conductivity between source and drain electrodes. This Schottky gate field transistor operation is well known to those skilled in the art.

For this type of semiconductor device, it is also well known that the source-drain metallization on the one hand and the gate metallization on the other hand require different metals and corresponding different metallization processing considerations. The source and drain contacts are ohmic contacts and therefore require a low resistance metal, such as a germanium-gold alloy or a germanium-gold-nickel alloy. On the other hand, the Schottky barrier beneath the Schottky gate metallization is best provided by other metals, such as aluminum, which are especially well suited for this particular type if electrical contact. Therefore, the different contact metallization systems used for the source-drain electrodes and gate electrodes, respectively, require corresponding separate and different successive masking procedures which are necessary to define the exact geometries of these device electrodes.

PRIOR ART

Previously, Schottky barrier gate field-effect transistors of the above type have been fabricated using, among other steps, one series of photolithographic masking and etching steps (with ultraviolet radiation exposure of resist layers) to form one resist mask and define the geometry of the source and drain electrodes for the device. Thereafter, another series of similar photolithographic masking and etching steps were used to form another resist mask and thus define the gate electrode geometry of the device. Standard successive photolithographic and ultraviolet radiaton resist development procedures of this type are disclosed, for example, in U.S. Pat. No. 3,914,784, assigned to the present assignee.

While the above multiple photolithographic UV processes have proven satisfactory in the fabrication of certain types of Schottky gate devices, these procedures have not been totally suitable to achieve the very narrow line widths, i.e., gate lengths, $L_g$, and spacings between source, drain and gate electrodes which are required of very small geometry, high frequency Schottky gate devices. The multiple ultraviolet radiation resist development procedures described above place a limitation on the minimum attainable electrode geometry and spacing of the resultant devices as a result of the inherent resolution, spacing accuracy and edge smoothness limitations of these conventional UV mask fabrication procedures. These device geometry limitations in turn impose a limit on the yields and the minimum achievable parasitic resistances, parasitic capacitances and gate lengths, $L_g$, for the resultant devices. Such parasitic resistance and capacitance limitations in turn limit the minimum achievable parasitic losses in these devices, whereas the limitations on the size reduction of the gate length, $L_g$, limits the device transit time and thus the maximum achievable operating frequency of such devices.

Attempts have been made to improve upon the geometry reduction capability of the above UV multiple mask fabrication processes by using only a single series of masking and etching steps in the formation of all the source, drain and gate electrodes of these Schottky gate field-effect devices. One such process is disclosed, for example, in U.S. Pat. No. 3,609,477 assigned to IBM. However, the utilization of the IBM process described in the above U.S. Pat. No. 3,609,477 obviously compromises the desire to maintain separability of the metal deposition procedures used to deposit the source-drain electrodes and the gate electrode, respectively, on the surface of the semiconductor channel of the device. Furthermore, the reproducibility and yields of this latter approach are questionable, and the minimum attainable line widths (i.e., gate lengths, $L_g$) using this latter process is only about 0.5 micrometer.

THE INVENTION

The general purpose of this invention is to provide a totally new process approach to the fabrication of Schottky barrier gate field-effect transistors and one which consistently achieves higher resolutions, higher electrode placement accuracies, smaller electrode line widths, smaller electrode spacings and higher yields than those same parameters achievable using standard multiple mask ultraviolet photolithographic processes of the prior art. At the same time, the present process provides the desired separability of the two or more metallization procedures used to form, respectively, the source-drain electrodes and the gate electrode of these transistors. Additionally, our process can be combined with lower resolution mask fabrication processes in order to provide an optimum combination or partitioning of these processes for the fabrication of a particular device or integrated circuit structure.

To accomplish this purpose and in the fabrication of our SBFET, we initially provide a thin, electrically active semiconductor layer at the surface of an electrically insulating or semi-insulating semiconductor substrate and using, for example, ion implantation or epitaxial growth techniques. Standard photolithography and semiconductor processing techniques are then used to define both a semiconductor mesa (formed out of the active semiconductor layer) and a coarse or low resolution alignment mark on the surface of the substrate. The semiconductor mesa and alignment mark patterns are defined in light sensitive polymers (photoresists) using optical masks and UV radiation, and standard semiconductor processing techniques are used to complete the semiconductor mesa and the alignment mark. The coarse alignment mark is positioned at a predetermined chosen location with respect to the semiconductor mesa structure formed from the thin electrically active layer. The above-defined structure is then coated with an electron sensitive polymer (electron resist), and an electron beam is used to register the electrical deflection field of the beam to the semiconductor mesa. This registration is accomplished by scanning the electron beam across the above-described coarse alignment mark and collecting, with a suitable detector, the backscattered or secondary electrons that are generated when the electron beam strikes the coarse alignment mark. Analysis of the data from the detector and subsequent alteration of the size and position of the electrical deflection field relative to the semiconductor mesa position brings the deflection field into registration with the chosen substrate pattern which, in this case, is the semiconductor mesa.

The electron beam is then deflected across the top surface of above-described structure in a manner to define the source and drain patterns of the SBFET which are located on the semiconductor mesa. In addition to forming these source and drain patterns, additional high resolution alignment marks are also exposed. Since these latter high resolution alignment marks are exposed during the same exposure processing step used to define the source and drain patterns, these high resolution alignment marks and the source and drain patterns are selfregistered. After these above exposures are completed, the structure is developed in a suitable chemical which dissolves all the exposed electron resist. The remaining patterns are then metallized by first evaporating a selected metallization (such as a Au/-Ge/Ni alloy for GaAs SBFET's) over the upper surface of these mask patterns and then removing the excess metal by dissolving the unexposed electron resist on the substrate.

After the source and drain metallization patterns are completed in accordance with the above procedure, the above electron beam registration and pattern exposure process is repeated for the gate pattern of the SBFET. This time the electron-beam-defined high resolution alignment marks are used for the gate electrode pattern registration, thereby providing the ultimate in gate, source and drain pattern registration accuracy. The gate pattern exposure consists of exposing a high resolution line pattern between the previously fabricated source and drain patterns. In addition to this line pattern, contact pad patterns which are linked to the gate pattern are also exposed. The subsequent process steps of development, metallization and dissolvement are similar to those used to form the above source and drain pattern metallization, except in this case the gate metallization is different from the source-drain metallization. In the fabrication of GaAs SBFETs, aluminum is the preferred gate metal.

Thus, separate and successive masking steps are utilized for the source-drain metallization and for the gate metallization, respectively, while simultaneously affording very high resolution metal deposition procedures which are useful in the high yield fabrication of small geometry, high frequency, low noise Schottky gate semiconductor devices.

Accordingly, it is an object of the present invention to provide a new and improved process for fabricating Schottky barrier gate field-effect transistors, integrated circuits, or other equivalent semiconductor devices having separate processing requirements for their lateral geometries.

Another object is to provide a high resolution process of the type described useful to achieve improved device geometry reduction and control.

Another object of the invention is to provide a microfabrication process of the type described which is useful to achieve improved spacing accuracy and edge smoothness of metallization patterns deposited on the surface of a semiconductor body.

A feature of the invention is the provision of a process of the type described which utilizes an optimized combination of electron beam microfabrication and photolithography in the development of SBFETs.

Another feature of the invention is the provision of a process which enables the fabrication of submicrongate Schottky barrier field-effect transistors (SBFETs), integrated circuits and other semiconductor devices with inherently and consistently higher process yields and higher pattern resolutions than are possible with conventional UV photolithography.

Another feature is the provision of a process of the type described in which all electron beam patterns are controlled by software statements, thereby lending themselves to convenient and rapid generation and modification. Therefore, the "mask" for these patterns has an indefinite lifetime which is an important advantage in comparison to any lithography technique which utilizes a mask (e.g., photolithography).

Another feature is the provision of a process of the type described wherein the metallization used for the source and drain electrodes is inherently suitable for electron beam registration as a result of the atomic number difference between this metallization and its supporting substrate (gallium arsenide).

Another feature of the invention is the provision of a microfabrication process of the type described wherein a metallization pattern controlling alignment mark is self-registered to the source and drain electrodes of the devices thus fabricated, thereby requiring only one critical registration step in the formation of the gate electrode pattern of the devices being fabricated.

Another feature is the provision of a microfabrication process of the type described wherein gate electrode registration and fabrication is completed prior to the alloying of the source, drain and gate electrodes. This enables the use of unprocessed (unannealed) alignment marks for particle back-scattering alignment purposes.

Another feature is the provision of a microfabrication process of the type described in which a steep contour in an electron beam resist layer is achieved by the exposure of the resist layer by high energy (20 KV) electron beams for the gate electrode pattern. This step makes possible the desired high aspect ratios for the gate metallization pattern, which is completed using conventional resist lift-off processes. This feature eliminates the need for a subsequent electroplating operation to thicken the gate electrode, and thereby simplifies the process without leaving a high series resistance in the gate electrode.

A further feature of the invention is the provision of a microfabrication process of the type described which utilizes oxide sputtering over the contact metallization patterns prior to alloying. This enables the edge definition of the source, drain and gate metallizations to be retained through alloying. Additionally, this oxidation step serves to passivate and protect the final device structures.

These and other objects and features of the invention will become more readily apparent in the following description of the accompanying drawings.

DRAWINGS

Figure 1:
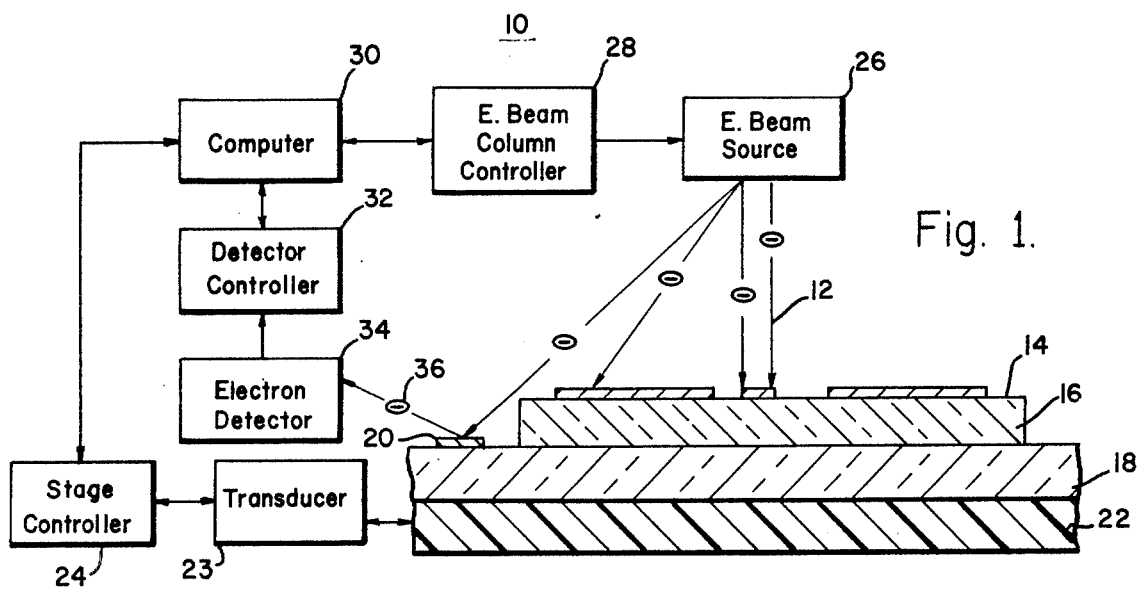
FIG. 1 is a block diagram representation of one suitable mask pattern control system useful for practicing the invention.

Referring now to FIG. 1, there is shown in block diagram form a closed-loop process control system 10 which may be utilized to provide controlled alignment between a focussed electron beam 12 and the surface 14 of a semiconductor body 16. In the example shown, the semiconductor body 16 is an electrically active mesa which was previously etched from a larger epitaxial layer grown on an underlying semi-insulating substrate 18 using conventional state-of-the-art epitaxial deposition techniques. Additionally, a coarse alignment reference mark 20 of a chosen high atomic number (high Z) metal is also deposited on the surface of the substrate 18 and is utilized as an essential part of the closed loop process control system 10 to be described. The substrate 18 is supported by an X-Y substrate positioning stage 22 which in turn is electromechanically coupled to suitable electromechanical positioning transducer 23 at the output of the stage controller 24.

The focussed electron beam 12 is provided by a conventional commercially available electron beam source 26 which includes electromagnetic focussing coils (not shown) for controlling the diameter of the electron beam 12. The electron beam source 26 also includes standard electromagnetic deflection coils (also not shown) for controlling the position of the electron beam 12 on the substrate surface 14. The exact position of the electron beam 12 and thus the exact location at which the beam 12 impinges on the semiconductor structure 16 is determined by the electron beam column controller 28 which is driven by a computer 30. The computer 30 controls and receives data from a detector controller 32 which, in turn, receives its input signal from an electron detector 34. The electron detector 34 is positioned as shown to receive backscattered electrons 36 which are reflected from the reference alignment mark 20 and from the substrate surface 14.

The quantity of backscattered electrons which are received from the surface of the structure shown in FIG. 1 is proportional to the atomic numbers of the surfaces of members 18 and 20 on which the electron beam 12 impinges. Thus, the scanning of the electron beam 12 such that its path crosses the entire length of the reference alignment mark 20, as well as some of the substrate 18 surface on both sides of the mark 20, produces a pulse-shaped video signal at the output of the electron detector 34. This signal is applied to the detector controller 32 which in turn is connected to drive the computer 30. This video signal is then processed by software programs operating in the memory of the computer 30. The result of this signal processing is the determination of the center coordinate of the alignment mark 20. The difference between this coordinate and the coordinate at which the mark 20 was expected to be found is used in calculating the electronic offset, size and rotation corrections that must be applied to the electrical scanfield in the e-beam source 26 in order to align it to the desired substrate pattern. In practice there are a total of four marks (like mark 20 but not shown) situated on the substrate 18 and at the four corners of the pattern field that are used in this alignment procedure.

The actual electrical signals which are used to modify the position, size and rotation of the electrical scanfield are generated in the electron beam column controller 28 in response to commands issued from the computer 30. The function of the stage controller 24 is to generate drive signals for the transducer 23, which in turn causes the X-Y substrate positioning stage 22 to move the next device field to a position which centers the field under the undeflected location of the electron beam 12. The accuracy with which this positioning must be accomplished is no greater than that required to position the alignment mark 20 within the search area defined by the alignment scan described above. The above closed loop processing per se of control signals which are generated by backscattered electrons received from alignment marks on a substrate is generally well-known in the art and is disclosed, for example, in copending application Ser. No. 601,943, now abandoned, its continuation in part application Ser. No. 785,801, and application Ser. No. 601,944, now abandoned, and all assigned to the present assignee. These techniques are also described by E. D. Wolf et al in an article entitled "Composition and Detection of Alignment Marks for Electron Beam Lithography," *Journal of Vacuum Science and Technology*, Vol. 21, No. 6, Nov./Dec. 1975 at page 1266 et seq. The processing of these alignment-markgenerated video signals to control the relative positions of an electron beam and an electron-resist covered substrate for the purpose of developing patterns in electron resists is also disclosed in varying degrees in the following publications, which like all of the above citations, are incorporated fully herein by reference:

1. Ozdemir, Faik S.; Wolf, Edward D.; and Buckley, Charles R.; "Computer-Controlled Scanning Electron Microscope System for High-Resolution Microelectronic Pattern Fabrication," *IEEE Transactions on Electron Devices*, May 1972, Volume ED-19, Number 5, pp-624-628.

2. Chang. T. H. Philip and Wallman, Bernard A., "A Computer-Controlled Electron-Beam Machine for Microcircuit Fabrication," *IEEE Transactions on Electron Devices*, May 1972, Volume ED-19, Number 5, pp-629-635.

3. Miyauchi, Sakae; Tanaka, Kazumitsu; and Russ, John C., "Automatic Pattern Positioning of Scanning Electron Beam Exposure," *IEEE Transactions on Electron Devices,*" June 1970, Volume ED-17, Number 6, pp-450-457.

4. U.S. Pat. No. 3,875,414.

The particular electronic stages of FIG. 1 and their functions and capabilities are generally well-known to those skilled in the art and, per se, form no part of the present invention. This above computer-controlled alignment of the electron beam 12 in the fabrication of a Schottky barrier gate field-effect transistor will be more fully understood in the following description of FIGS. 2a through 2j illustrating one device fabrication process embodying the invention.

Figure 2A:
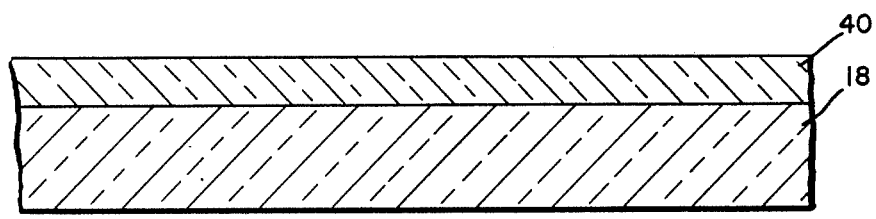
FIGS. 2a through 2j illustrate, respectively, a series of semiconductor processing steps utilized in a preferred process embodiment of the invention for fabricating SBFETs.
Figure 2B:
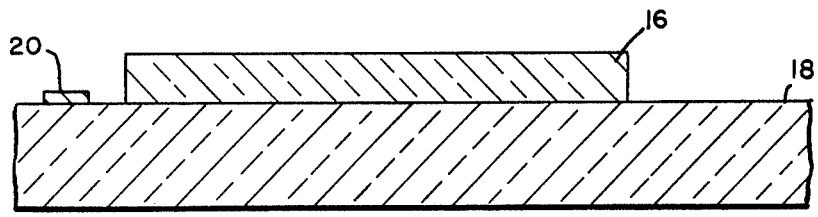
Figure 2C:
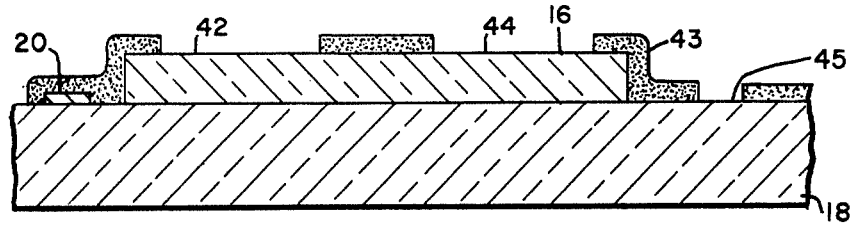

Referring now to FIG. 2a, there is shown a substrate 18, such as semi-insulating gallium arsenide wafer, having a resistivity typically in excess of $10^5$ ohm.centimeters and upon which an electrically active layer 40 has been formed, such as by epitaxial deposition. Conventional photolithographic masking and etching techniques may then be utilized to form both the epitaxial mesa 16 from the layer 40 and also the reference or coarse alignment mark 20 as shown in FIG. 2b. The structure in FIG. 2b is then coated with an electron-resist layer (not shown) over its entire upper surface and then the electron beam 12 is scanned across the entire resist coated surface to generate the video pulse mentioned above. Backscattered electrons 36 which are generated at surface of the alignment mark 20 travel through the electron resist and are received detected at the electron detector 34, thereby providing the output video signal which is processed, as described above, in order to provide an alignment of the deflection pattern of the electron beam 12 and the semiconductor mesa 16. After this alignment has been accomplished, the aligned electron beam is deflected to the areas 42, 44 and 45 in the electron resist coating 43 to thereby expose these regions of electron resist. These exposed regions of electron resist are then developed using a suitable electron resist solvent to ultimately produce the electron-resist mask as shown in FIG. 2c. These openings 42 and 44 are referenced to the alignment mark 20, so that the subsequent source and drain electrodes formed in these openings 42 and 44 will also be referenced to the coarse alignment mark 20 and hence to the mesa 16. (The opening 45 is for the fine alignment mark which is self-registered to the source and drain pattern.)

Figure 2D:
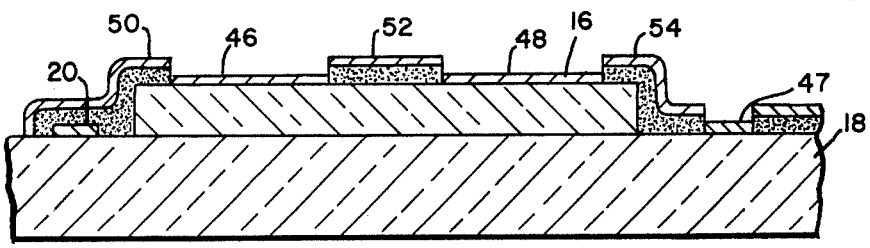

The formation of the source and drain electrodes is illustrated in FIG. 2d wherein a thin layer of germanium-gold-nickel (Ge/Au/Ni) is initially deposited on the entire upper surface of the structure of FIG. 2c so as to leave source and drain metallization patterns 46, 48, and the fine alignment mark 47 in direct contact with the upper surface of the epitaxial mesa 16. Once this metal contact deposition procedure is completed, conventional electron resist lift-off procedures are utilized to remove the strips of excess metallization 50, 52 and 54 which overlie the electron-resist pattern remaining on the mesa 16. These procedures typically involve immersing the structure of FIG. 2d in a chosen solvent which, in time, will dissolve the remaining electron-resist layer in FIG. 2d and thus lift-off the overlying metallization strips 50, 52 and 54. This procedure will leave the resultant structure shown in FIG. 2e.

Figure 2E:
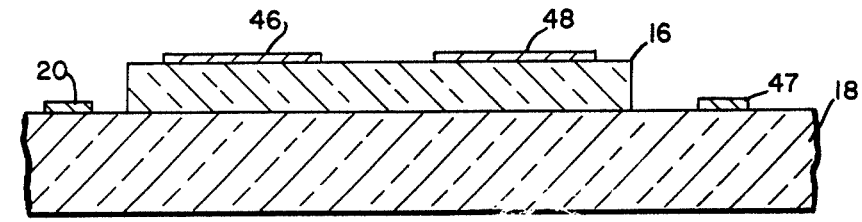
Figure 2F:
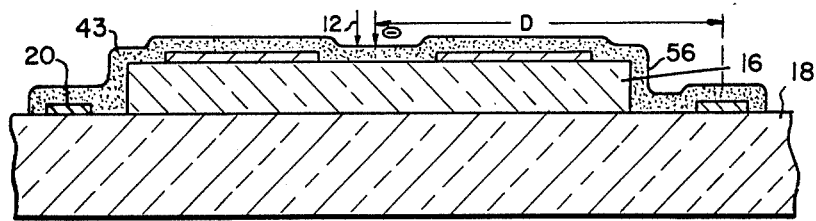

Upon the completion of the structure shown in FIG. 2e, its upper surface is again coated with electron resist as shown in FIG. 2f and placed in the electron beam system of FIG. 1. The electron beam 12 is swept across the fine alignment mark 47 so that the backscattered electrons 36 generated by the alignment mark 47 and passing through the resist layer are received by the detector 34 and may be utilized to generate a signal which in turn precisely establishes the distance D between the position of the fine alignment mark 47 and the edge of the electron beam 12 as shown in FIG. 2f. This procedure enables the electron beam 12 to be precisely registered with respect to the source and drain electrodes 46 and 48 which were also self-registered to the fine alignment reference mark 47. This procedure enables the source-to-gate and drain-to-gate spacing of the SBFET device being fabricated to be very closely controlled.

Figure 2G:
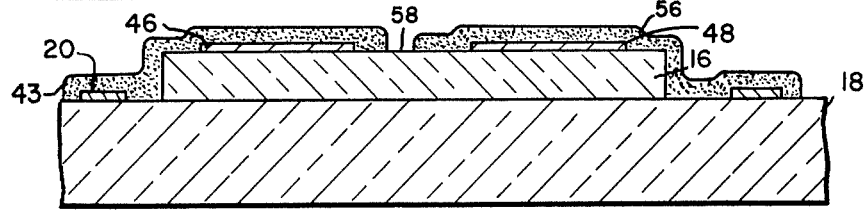

Once the dimension D in FIG. 2f has been established, the chosen electron sensitive resist pattern 56 on the surface of the structure in FIG. 2f is exposed by the electron beam 12. Using a suitable chemical developer, the portion 58 of the resist layer 56 exposed by the electron beam 12 is removed, as shown in FIG. 2g, to thereby form the gate electrode opening 58 for the SBFET being fabricated. Thereafter, a chosen Schottky gate metallization, such as aluminum, is deposited over the entire upper surface of the structure shown in FIG. 2g, thus making direct Schottky contact with the portion of the epitaxial layer 16 in the opening 58. Thereafter, conventional lift-off procedures as previously described are utilized to remove the Schottky gate metallization overlying the resist layer 56 remaining on the structure in FIG. 2g. This step, of course, leaves the completed electrode pattern in FIG. 2h, with the selected asymmetrical electrode spacing indicated. For optimum SBFET device operation and performance, a predetermined asymmetrical spacing of the Schottky gate electrode 60 between the source and drain electrodes 46 and 48 is preferred, and this spacing is typically about 0.5 micrometers between source and gate electrodes 46 and 60 and 1.0 micrometers between gate and drain electrodes 60 and 48, respectively.

Figure 2H:
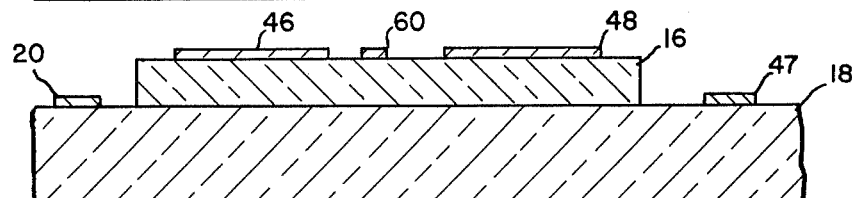
Figure 2I:
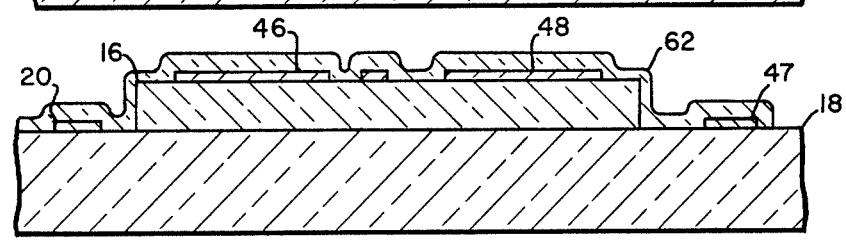
Figure 2J:
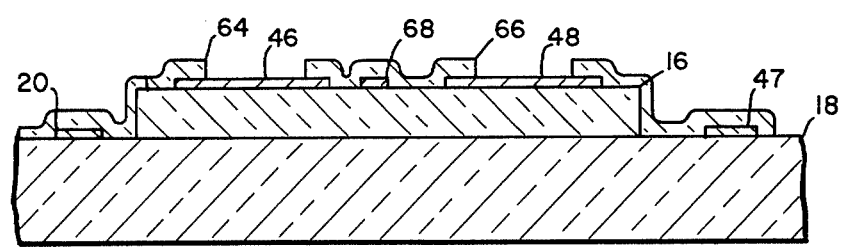

The field-effect transistor structure shown in FIG. 2h is then transferred to a conventional oxide deposition station where either a thin layer 62 of silicon dioxide or other suitable passivating dielectric material, e.g., silicon nitride, is formed using either conventional oxide or nitride growth or deposition techniques. Thereafter, the structure shown in FIG. 2i is appropriately masked and etched using a suitable etching process, such as oxygen plasma etching, to provide the openings 64 and 66 as shown in FIG. 2j for the source and drain contacts to the device. A similar opening (not shown) is provided along the gate width in order that electrical contact be made to the gate electrode 68.

Figure 3A:
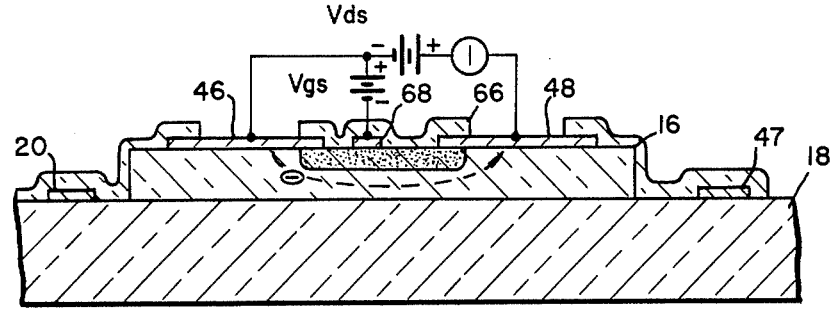
FIGS. 3a and 3b illustrate the conventional fieldeffect transistor operation for the device of FIG. 2j after the latter device structure has been completed.

The completed and biased SBFET structure is shown in further detail in FIG. 3a, with a gate-to-source voltage, $V_{gs}$, and a source-to-drain voltage, $V_{ds}$, applied to the device. These voltages control the width W of the channel depletion region 69 between the source and drain electrodes and thus the number of electrons $e$ which pass from the source to the drain electrode as indicated. Typically, the epitaxial mesa 16 is on the order of about 0.2 micrometers in thickness and may be deposited, for example, using liquid-phase epitaxial growth techniques such as those described in a copending application Ser. No. 530,336, entitled "Liquid Phase Epitaxial Process for Growing Semi-Insulating GaAs Layers", assigned to the present assignee. Alternatively, the original layer 40 may be formed using ion implantation doping techniques such as those described in U.S. Pat. No. 3,914,784 of R. G. Hunspurger et al, assigned to the present assignee.

Figure 3B:
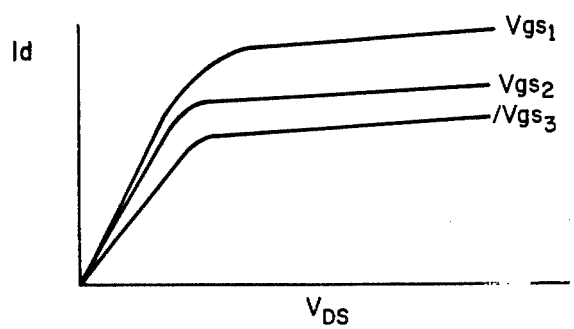

FIG. 3b shows typical current-voltage characteristics for the Schottky gate field-effect transistor shown in FIG. 3a, and these I-V characteristics are well known in the art and are described in detail in many prior art publications.

Various modifications may be made to the above-described embodiments without departing from the true scope of this invention. For example, the invention is not limited to the fabrication of Schottky gate field-effect transistors, and may instead be utilized in the fabrication of a wide variety of semiconductor devices and integrated circuits which require the above-described high resolution processing of separate kinds of metallization patterns. One instance where such diverse contact metallizations will be utilized is in the fabrication of GaAs integrated circuits which operate at very high frequencies (1 to 10 GHz) with low power dissipation. Such integrated circuit may, for example, require closely spaced Schottky and ohmic contacts which could be made using the above-described process.

What is claimed is:

1. A process for fabricating small geometry semiconductor devices having contact electrodes of different metals or metal alloys comprising the steps of:
   (a) forming a first mask on the surface of a semiconductor body and having one or more openings therein positionally referenced to a first alignment mark,
   (b) depositing at least one metal electrode in one of said openings to thereby form one type of electrical contact at the surface of said semiconductor body,
   (c) depositing a second alignment mark in another of said openings so that said second alignment mark is registered to said one or more openings in said first mask,
   (d) forming a second mask on the surface of said semiconductor body and having an opening therein which is positionally referenced to said second alignment mark, and
   (e) depositing another metal electrode in said second opening to thereby form a different type of metal contact on the surface of said semiconductor body and precisely spaced from said one metal electrode, whereby both of said metal electrodes are referenced to said second alignment mark.

2. A process for fabricating a field-effect transistor having source, drain and gate electrodes deposited on the surface of a semiconductor body and including the steps of:
   (a) forming one resist mask on said surface of said semiconductor body and having openings therein positionally referenced to a chosen reference location,
   (b) depositing one type of contact metal in two of said openings to thereby form the source and drain electrodes of said transistor,
   (c) depositing a fine alignment mark in another of said openings which is registered to said source and drain electrodes,
   (d) forming another resist mask on said surface of said semiconductor body and having an opening therein between said source and drain electrodes which is positionally referenced to said fine alignment mark, and
   (e) depositing another different type of contact metal in the last named opening to thereby form said gate electrode of said transistor, whereby said source, drain and gate electrodes are all positionally referenced to said fine alignment mark at a single reference location and to each other, thereby attaining a high resolution and a spacing accuracy for said source, drain and gate electrodes of said field-effect transistor.

3. The process defined in claim 2 wherein the formation of said resist masks includes depositing successive electron resist masks on the surface of said semiconductor body and successively developing said electron resist masks after referencing the position and deflection pattern of an electron beam to reference alignment marks defined in the preceding mask formation step, whereby all of the source, drain and gate openings in said resist masks are referenced to each other.

4. The process defined in claim 3 wherein said electron beam resist is an organic polymer layer sensitive to charged particle radiation.

5. The process defined in claim 2 which also includes:
   (a) initially scanning a particle beam over a coarse alignment mark at said chosen reference location to provide backscattering of particles therefrom,
   (b) sensing backscattered particles from said coarse alignment mark to determine the initial position of said metal alignment mark relative to the intial position of the pattern of said particle beam used for mask fabrication, and
   (c) providing controlled relative movement between said particle beam pattern and said semiconductor body in response to the sensed backscattered particles from said coarse alignment mark to achieve an initial controlled alignment between said semiconductor body and said particle beam pattern prior to the formation of said one mask on said semiconductor body.

6. The process defined in claim 5 which further includes sensing backscattered particles from said fine alignment mark prior to the formation of said another mask on said semiconductor body, and then moving said particle beam into alignment with said opening in said another resist mask, while being registered to said fine alignment mark whereby a focussed particle beam pattern can be moved a precisely controlled distance from said fine alignment mark to expose a precise area of resist between said source and drain electrodes and define said opening in said another mask and the position of said gate electrode for said transistor.

7. A process for forming different kinds of metal electrodes on the surface of a semiconductor body and in successive processing steps, including:
   (a) forming a metal electrode mask on the surface of a semiconductor body and positionally referenced to a coarse alignment mark,
   (b) providing a reference mark opening in said metal electrode mask,
   (c) depositing a fine alignment mark in said reference mark opening, so that said fine alignment mark is self-registered to said metal electrode mask,
   (d) depositing one or more metal electrodes in an opening or openings in said metal electrode mask,
   (e) forming a resist layer on an exposed area of said semiconductor body adjacent said opening or openings therein, and (f) moving a particle beam a controlled distance from said fine alignment mark and into alignment with a selected area of said resist layer, whereby said particle beam may be used to develop said selected area of said resist layer and thereby provide a high spacing accuracy and resolution between a different metal electrode deposited at said selected area and the said one or more metal electrodes previously deposited in said openings in said metal electrode mask.

8. The proces defined in claim 7 wherein said different meal electrode is deposited between two previously deposited electrodes on the surface of said semiconductor body, whereby said different metal electrode may serve as a field-effect transistor gate electrode between two previously deposited source and drain electrodes.

9. The process defined in claim 7 wherein said metal electrode mask is formed by initially projecting charged particles onto said coarse alignment mark and processing backscattered electrons therefrom to control the relative movement and spacing between said coarse alignment mark and said semiconductor body, thereby enabling resist layers on said semiconductor body to be developed with said charged particle beam in the formation of said metal electrode mask.

10. The process defined in claim 8 wherein said charged particle beam is also projected onto said fine alignment mark and backscattered therefrom and the backscattered particles are processed to provide exact control of the spacing between said fine alignment mark and said selected area of said resist layer with which said charged particle beam is subsequently aligned, whereby said different metal electrode is self-registered to the one or more previously formed electrodes.

11. The process defined in claim 10 wherein said different metal electrode is deposited between two previously deposited electrodes on the surface of said semiconductor body, whereby said different metal electrode may serve as a field-effect transistor gate electrode between two previously deposited source and drain electrodes.

12. A process for fabricating Schottky gate field-effect transistors of the type having source and drain electrodes of one type of metal or metal alloy and a Schottky gate electrode therebetween of a different kind of metal or metal alloy including the step of:

(a) forming a metal electrode mask on the surface of a semiconductor body and positionally referenced to a coarse alignment mark, said mask formed by initially projecting charged particles onto said coarse alignment mark and processing backscattered particles therefrom to control the relative movement and spacing between said coarse alignment mark and said semiconductor body, thereby enabling resist layers on said semiconductor body to be developed with said charged particle beam in the formation of said metal electrode mask, (b) providing a reference mark opening in said metal electrode mask, (c) depositing a fine alignment mark in said reference mark opening, so that said fine alignment mark is self-registered to said metal electrode mask, (d) depositing source and drain electrodes of one type of metal or metal alloy in spaced apart openings in said metal electrode mask, (e) forming a resist layer on an exposed area of said semiconductor body between said source and drain electrodes thereon, (f) projecting said charged particle beam onto said fine alignment mark and backscattering particles therefrom and processing said backscattered particles to generate control signals for controlling the exact spacing between said fine alignment mark and predefined area on said resist layer between said source and drain electrodes, (g) projecting charged particles onto said predefined area of said resist to thereby develop same and enable same to be removed to expose a predefined area of said semiconductor body between said source and drain electrodes, and (h) depositing a different metal or metal alloy in said predefined opening between said source and drain electrodes to form a Schottky gate electrode with high resolution and spacing accuracy between said source and drain electrodes, whereby small electrode to electrode spacings on the order of 0.5 micrometers or less may be achieved with high spacing accuracies and resolutions.

13. The process defined in claim 12 which further includes depositing a surface passivation layer over exposed portions of said semiconductor body adjacent said source, drain and Schottky gate electrodes, and annealing said semiconductor body and electrodes formed thereon at a predetermined elevated temperature and for a predetermined time sufficient to form good ohmic and Schottky gate contacts for said source, drain and Schottky gate electrode, respectively, on the surface of said semiconductor body.

* * * * *